US012763782B2

(12) United States Patent
Gruber et al.

(10) Patent No.: US 12,763,782 B2
(45) Date of Patent: Oct. 13, 2026

(54) DIGITAL-TO-ANALOG CONVERTER AND METHOD FOR AMPLITUDE AND SKEW ERROR CORRECTION IN THE DIGITAL-TO-ANALOG CONVERTER

(71) Applicant: Intel Corporation, Santa Clara, CA (US)

(72) Inventors: Daniel Gruber, St. Andrae (AT); Michael Kalcher, Villach (AT); Martin Clara, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 18/145,025

(22) Filed: Dec. 22, 2022

(65) Prior Publication Data

US 2024/0213992 A1 Jun. 27, 2024

(51) Int. Cl.
*H03M 1/06* (2006.01)

(52) U.S. Cl.
CPC ................................ *H03M 1/0604* (2013.01)

(58) Field of Classification Search
CPC ..... H03M 1/0604; H03M 1/662; H03M 1/742
See application file for complete search history.

(56) References Cited

U.S. PATENT DOCUMENTS 4,996,530 A * 2/1991 Hilton .................... G12B 13/00 341/120
7,466,252 B1 * 12/2008 Radulov ............. H03M 1/1061 341/120
9,577,657 B1 * 2/2017 Clara ....................... H03M 3/38
9,941,893 B2 * 4/2018 Reddy Naru ....... H03M 1/1038
10,965,302 B1 * 3/2021 Zhao ...................... H03M 7/165
11,128,310 B1 * 9/2021 Zhao .................... H03M 1/1071
11,817,873 B1 * 11/2023 Babaee ................. H03M 1/742
2014/0313065 A1 * 10/2014 Schafferer ........... H03M 1/0678 341/118
2016/0094235 A1 * 3/2016 Kuttner ................. H03M 1/662 341/144
2018/0191362 A1 * 7/2018 Reddy Naru ....... H03M 1/1038
2021/0194492 A1 * 6/2021 Zhao ...................... H03M 1/109
2022/0200617 A1 * 6/2022 Clara .................. H03M 1/1014
2022/0255555 A1 * 8/2022 Zhao .................... H03M 1/0617
2024/0063805 A1 * 2/2024 Mulder ............... H03M 1/0624
2024/0063807 A1 * 2/2024 Westra ................ H03M 1/1014
2024/0223198 A1 * 7/2024 Gruber ..................... H03M 1/10
2025/0183904 A1 * 6/2025 Gruber ................ H03M 1/1033

* cited by examiner

*Primary Examiner* — Lam T Mai

(74) *Attorney, Agent, or Firm* — 2SPL Patent Attorneys PartG mbB; Yong Beom Hwang

(57) ABSTRACT

A digital-to-analog converter (DAC) and a method for correcting amplitude and/or skew error in a DAC. The DAC includes a main DAC, cell error determination circuit, a correction DAC, and a combiner. The main DAC includes a plurality of DAC cells. The cell error determination circuit is configured to determine an amplitude error and/or a skew error of each of the plurality of DAC cells and generate error data of the DAC based on the input data to the DAC cells. The correction DAC is configured to generate an error signal based on the error data. The combiner is configured to combine the error signal with an output of the main DAC.

22 Claims, 15 Drawing Sheets

DIGITAL-TO-ANALOG CONVERTER AND METHOD FOR AMPLITUDE AND SKEW ERROR CORRECTION IN THE DIGITAL-TO-ANALOG CONVERTER

BACKGROUND

A digital-to-analog converter (DAC) includes a plurality of DAC cells. In a DAC, several different performance limitations are present. One limiting factor of DAC converter performance in terms of linearity and noise is cell matching. While amplitude errors are very commonly being corrected by calibration of individual DAC cells, timing skew errors of DAC cells are usually not being corrected. However, with higher sampling and signal frequencies, timing skew errors can be a major limitation in DAC performance.

Cell matching of DACs in terms of cell weight or amplitude error can be calibrated (static or dynamic calibrations). In current steering DACs, this is often done with a small static correction DAC in the DAC cells or a split current source with a fixed and trimmed part. Amplitude errors in capacitive DACs are even more complicated to correct in analog fashion and usually require some sort of digital correction. However, extra hardware is needed for trimming cell amplitudes. Random skew errors may be minimized down to a tolerable level by scaling up circuitry and designing for matching. However, sizing hardware for sufficiently low skew errors requires to increase device sizes to improve matching. This impacts area and power dissipation due to bigger devices than needed for functionality.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In a DAC that is built up with a plurality of cells (DAC cells), the individual DAC cells may show random variations, which is called mismatch. Mismatch can have deterministic cause or be originated from random variations in devices from processing, etc. Different device types show different mismatch behavior. Generally, for reducing random variations, devices have to be made bigger in order to improve matching between them.

Figure 1:
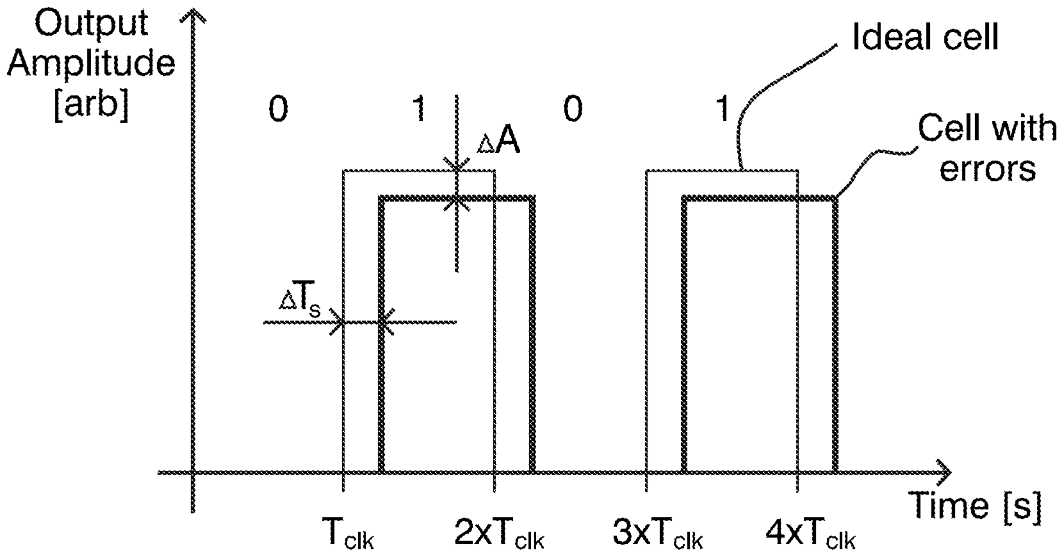
FIG. 1 shows amplitude and skew error of one DAC cell.

Cells within one DAC may show variations of amplitude and timing behavior, called amplitude mismatch and timing skew, respectively. FIG. 1 shows amplitude and skew error of one DAC cell. A timing skew is the difference of the ideal time instant when the cell should switch to when the cell actually switches, depicted as $\Delta Ts$. An amplitude error is the difference of the cell amplitude to the ideal cell, depicted as $\Delta A$.

Figure 2:
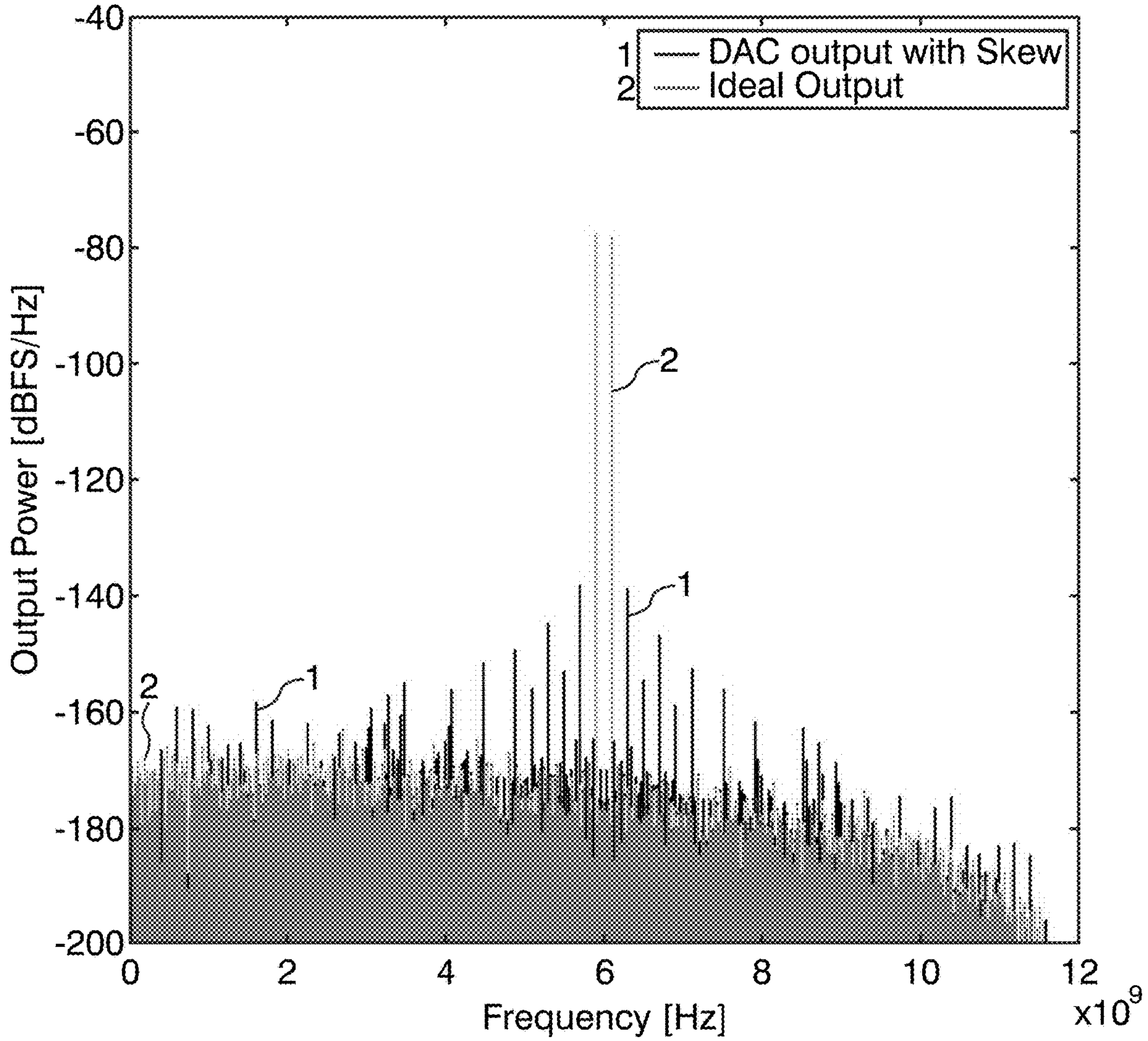
FIG. 2 shows DAC outputs for a 6 GHz two-tone test signal with skew errors and without skew errors.

The skew and amplitude errors ultimately limit the DAC performance. FIG. 2 shows DAC outputs for a 6 GHZ two-tone test signal with skew errors and without skew errors (i.e., ideal output). FIG. 2 shows the output spectrum of a 13-bit segmented DAC with a unary coded most significant bit (MSB) segment of 5 bits. The unary coded segment has a random skew error with a standard deviation of 200 fs. The introduced errors are clearly visible as tones in the entire spectrum, limiting spurious-free dynamic range (SFDR) and signal-to-noise and distortion ratio (SNDR) performance. A skew error of only 200 fs standard deviation is very small and requires spending significant efforts in design. Hence there is a desire to correct for these errors.

Figure 3:
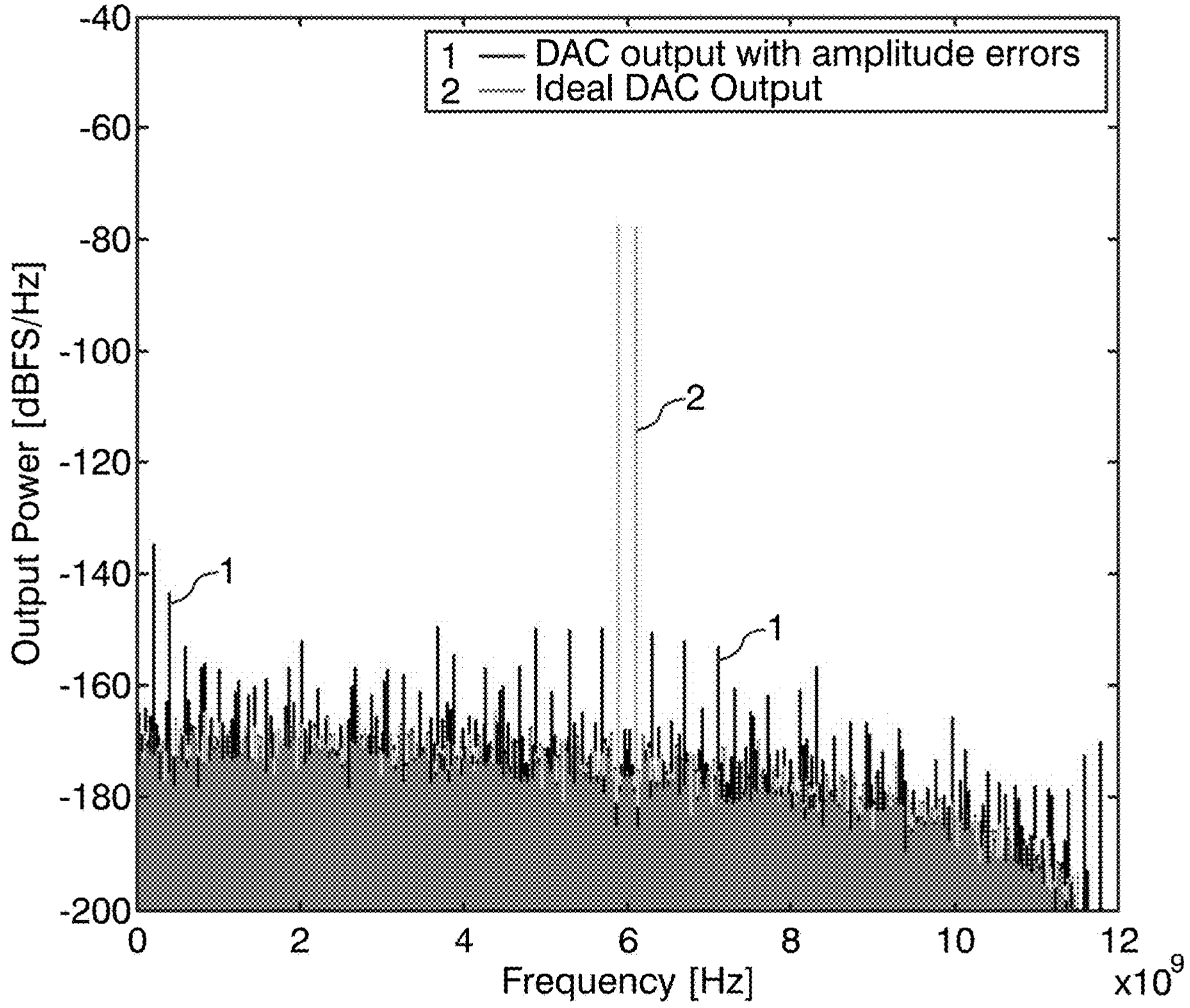
FIG. 3 shows DAC outputs for a 6 GHz two-tone test signal with and without amplitude errors.

The same is true for amplitude errors. FIG. 3 shows DAC outputs for a 6 GHZ two-tone test signal with and without amplitude errors. FIG. 3 shows the output spectrum of the DAC with and without random amplitude errors in the MSB segment, where the standard deviation of the amplitude error is 0.5%. The errors are clearly visible in the entire spectrum and limit SFDR and SNDR performance.

Examples for skew and amplitude error correction in a DAC are explained hereafter. In examples, the skew and/or amplitude errors of DAC cells are determined/calculated on a per cell basis and fed to a correction DAC that subtracts the errors from the DAC output. The skew and amplitude errors of the DAC cells may be pre-determined/calculated using either encoded data or a priori knowledge of an input code to cell mapping. A correction value is then subtracted from the main DAC output in an analog domain using a dedicated correction DAC that is out-phased to (or alternatively in-phase with) the main DAC for skew errors and in-phase with the main DAC for amplitude errors. The examples can correct skew errors and amplitude errors within a DAC, allowing to relax design requirements in terms of amplitude and timing skew matching. This can result in reduced area and significantly reduced power consumption. The correction DAC for correcting the errors is a very small area/power overhead as the errors to be corrected are typically very small to begin with.

Figure 4A:
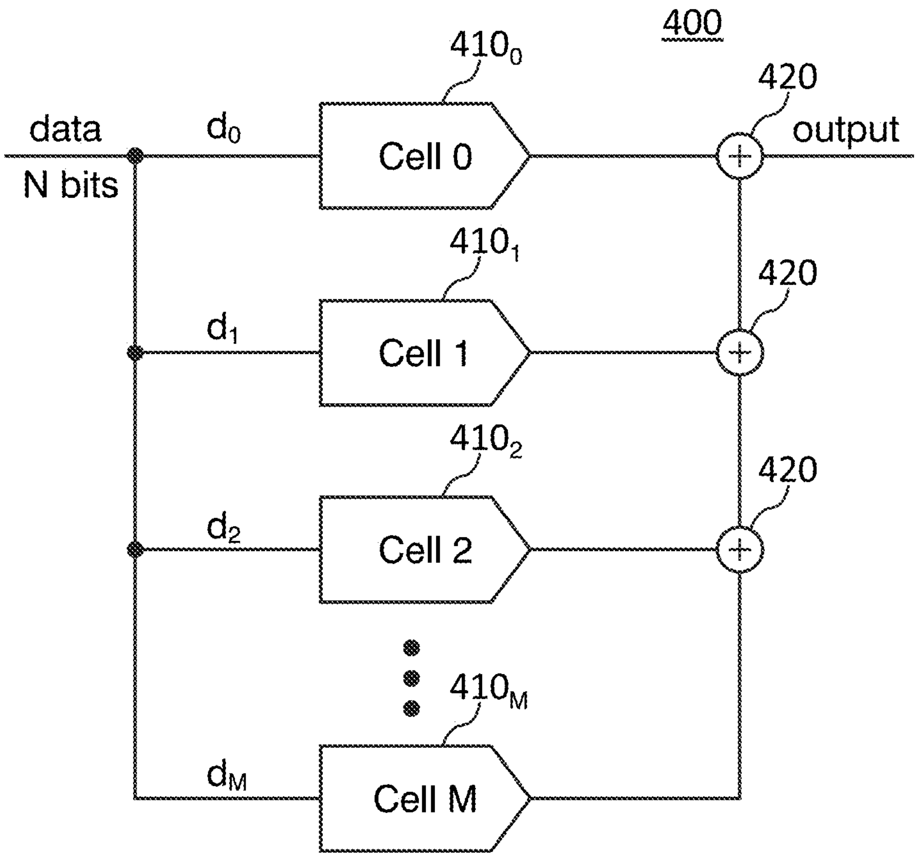
FIG. 4A shows an example DAC.

FIG. 4A shows an example DAC. A DAC 400 includes a plurality of DAC cells (Cell 0, . . . , Cell M) $\mathbf{410}_0$-$\mathbf{410}_M$. Each DAC cell $\mathbf{410}_0$-$\mathbf{410}_M$ generates an output signal based on an input bit to each DAC cell $\mathbf{410}_0$-$\mathbf{410}_M$. Each DAC cell $\mathbf{410}_0$-$\mathbf{410}_M$ contributes to the output of the DAC 400 depending on the input data to each DAC cell $\mathbf{410}_0$-$\mathbf{410}_M$. The outputs of the DAC cells $\mathbf{410}_0$-$\mathbf{410}_M$ are combined by a combiner(s) 420 to generate an output of the DAC 400.

Figure 4B:
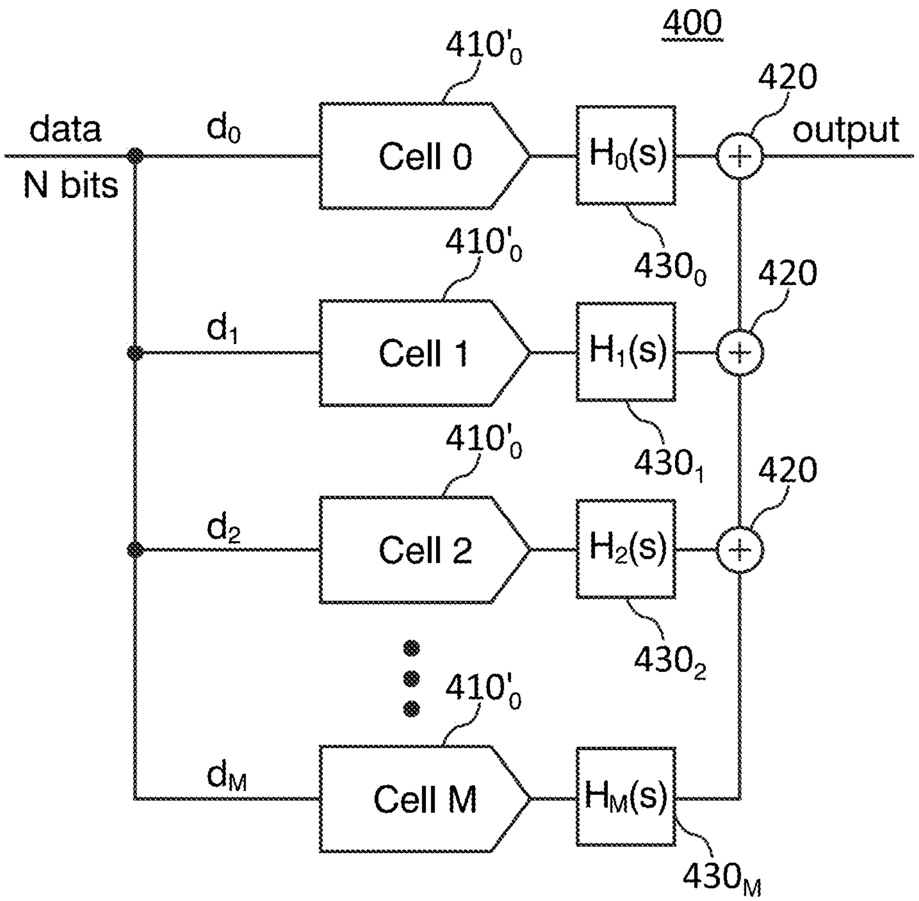
FIG. 4B shows a model for the DAC of FIG. 4A.

FIG. 4B shows a model for the DAC 400 of FIG. 4A. The DAC 400 may be modeled with an ideal DAC cell $\mathbf{410'}_0$-$\mathbf{410'}_M$ with a transfer function $\mathbf{430}_0$-$\mathbf{430}_M$ for each cell. The amplitude error and the skew error of each DAC cell may be modeled as the transfer function $H_0(s)$, $H_1(s)$, . . . , $H_M(s)$ $\mathbf{430}_0$-$\mathbf{430}_M$ for each DAC cell.

Figure 5:
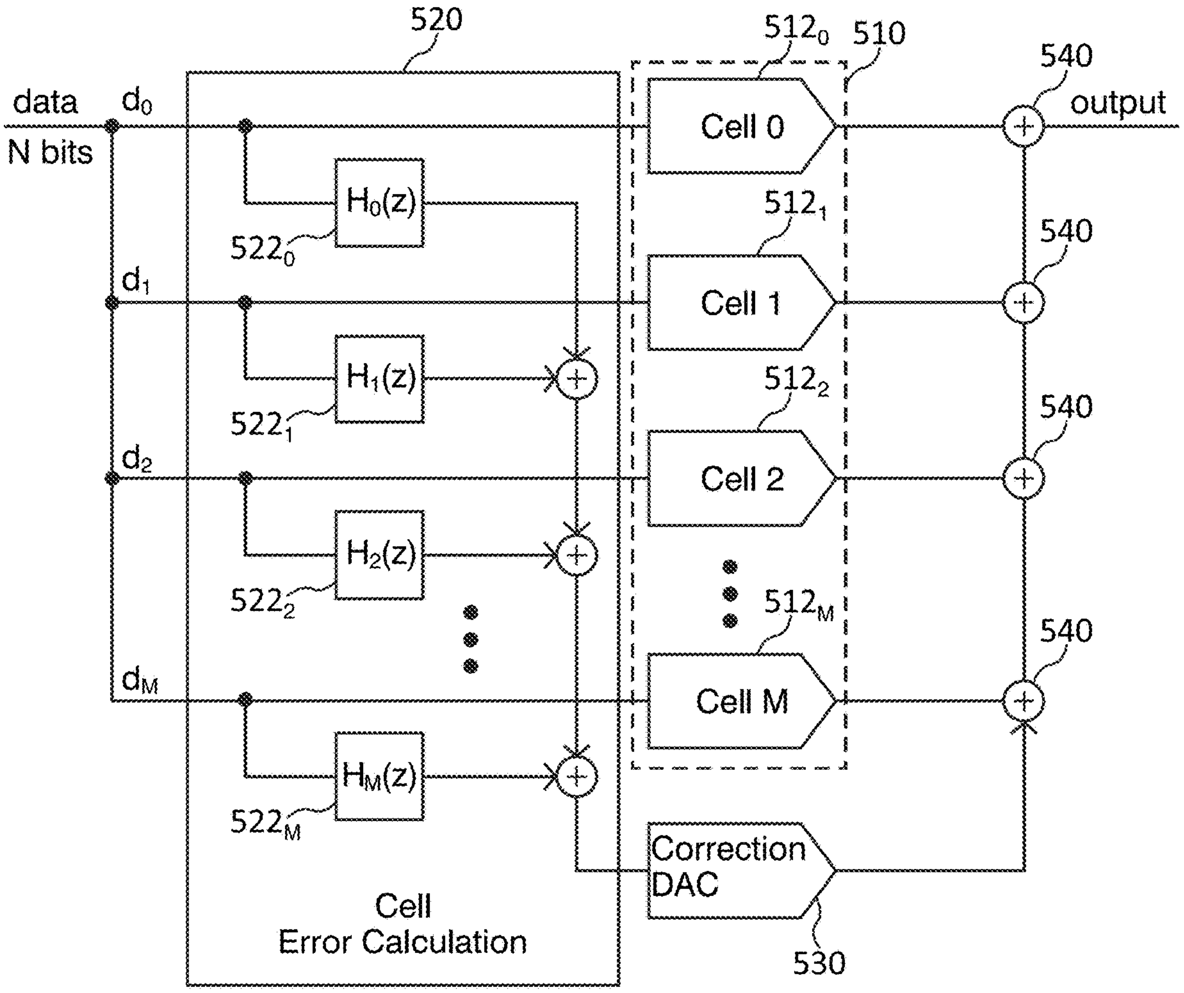
FIG. 5 shows a block diagram of a DAC configured for amplitude and/or skew error correction in accordance with one example.

FIG. 5 shows a block diagram of a DAC configured for amplitude and/or skew error correction in accordance with one example. The DAC 500 includes a main DAC 510, a cell error determination circuit 520, a correction DAC 530, and a combiner(s) 540. The main DAC 510 includes a plurality of DAC cells (Cell 0 to Cell M) $\mathbf{512}_0$-$\mathbf{512}_M$. Each DAC cell $\mathbf{512}_0$-$\mathbf{512}_M$ generates an output that contributes to the output of the DAC 500 based on the input data to each DAC cell $\mathbf{512}_0$-$\mathbf{512}_M$. The input data may be a binary-coded bit or a thermometer coded bit, or the like. Cell 0 $\mathbf{512}_0$ generates an output based on input data do, Cell 1 $\mathbf{512}_1$ generates an output based on input data d1, and so on. The outputs of the plurality of DAC cells $\mathbf{512}_0$-$\mathbf{512}_M$ are combined by a combiner(s) 540 to generate the DAC output.

The cell error determination circuitry 520 is configured to calculate a digital representation of the errors introduced by the plurality of DAC cells $\mathbf{512}_0$-$\mathbf{512}_M$ of the main DAC 510. As one illustrative, non-limiting, example, the skew and amplitude error introduced by each DAC cell $\mathbf{512}_0$-$\mathbf{512}_M$ of the main DAC 510 may be modelled as a transfer function as follows:

$$H(s) = (1 + \Delta A)e^{-s\Delta T_s}, \quad \text{Equation (1)}$$

where ΔA represents the amplitude error of a DAC cell and $\Delta T_S$ represents the skew error of a DAC cell.

The term (1+ΔA) in Equation (1) represents the amplitude of a cell including the amplitude error, the term $e^{-s\Delta T_s}$ represents the time shift due to skew error of a DAC cell. By finding a digital equivalent transfer function H(z) of the transfer function H(s), the error can be modelled in digital domain.

In examples, the cell error determination circuitry 520 may include a digital filter $\mathbf{522}_0$-$\mathbf{522}_M$ for each DAC cell $\mathbf{512}_0$-$\mathbf{512}_M$ of the main DAC 510. The digital filter $\mathbf{522}_0$-$\mathbf{522}_M$ may be any linear or non-linear digital filter. The digital input data to each DAC cell $\mathbf{512}_0$-$\mathbf{512}_M$ of the main DAC 510 is input to the corresponding digital filter $\mathbf{522}_0$-$\mathbf{522}_M$. Each digital filter $\mathbf{522}_0$-$\mathbf{522}_M$ processes the input data for the corresponding DAC cell $\mathbf{512}_0$-$\mathbf{512}_M$ and generates an error corresponding to the skew and/or amplitude error that the corresponding DAC cell $\mathbf{512}_0$-$\mathbf{512}_M$ introduces to the DAC output. All outputs of the digital filters $\mathbf{522}_0$-$\mathbf{522}_M$ are summed up and sent to the correction DAC 530. Summing up all errors of the individual cells yields the total error due to cell mismatch for amplitude and/or skew. The output of the correction DAC 530 is then subtracted from the output of the main DAC 510.

The error determination/identification requires a prior measurement of the DAC cell-specific cell error(s). This measurement may be done using external measurement equipment at manufacturing stage or during a factory calibration. Alternatively, a feedback path on-chip or off-chip to a receiver circuit capable of characterizing the errors may be used. The measurement procedure may include measuring differences between DAC cells or performing integral non-linearity (INL)/differential non-linearity (DNL) like measurements of the DAC transfer characteristic.

The representation of the amplitude error is straight forward. The amplitude error is the difference of the cell amplitude to the ideal cell. The filter coefficient for the amplitude error may be determined based on the amplitude difference of the actual cell to the ideal cell. The ideal cell might be one cell in the DAC chosen to be the reference cell. The amplitude of the ideal cell might also be calculated out of a weighted average of a set of DAC cells, e.g. the mean value of amplitudes of all cells in a unary coded MSB segment.

Figure 6A:
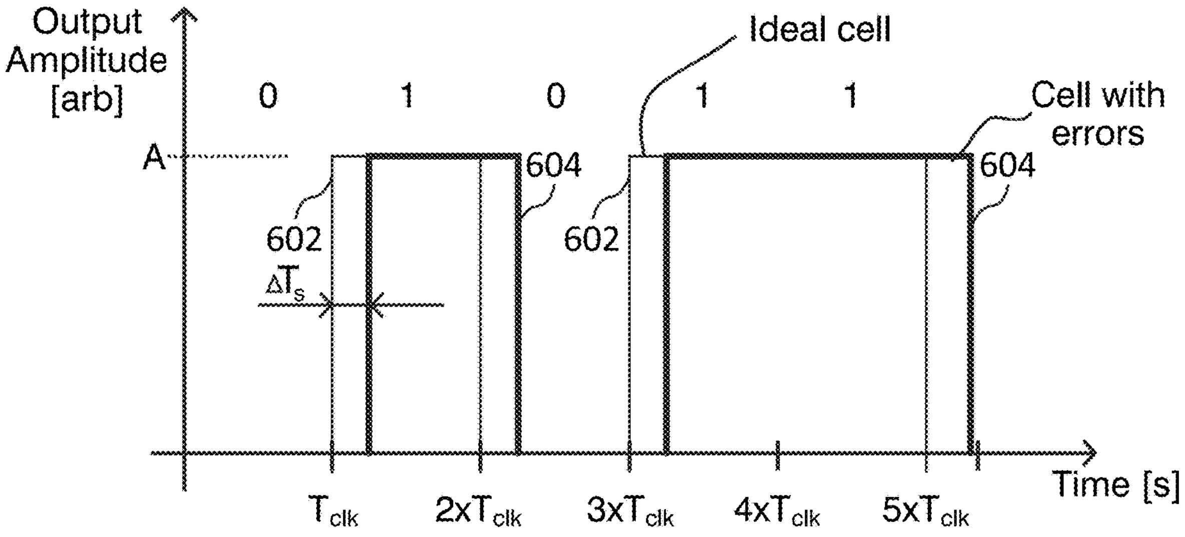
FIG. 6A shows an example of skew of a DAC cell.
Figure 6B:
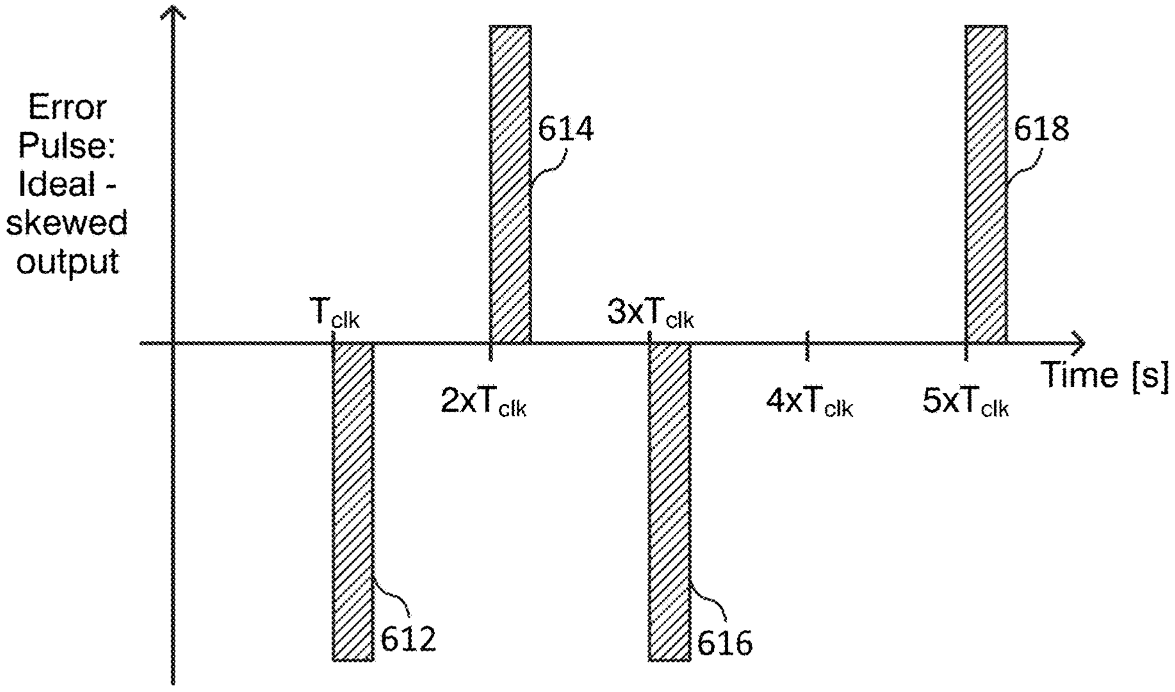
FIG. 6B shows an error pulse due to the skew.

The skew error modelling in digital domain is explained hereafter. Skew errors are time shifts of the cell output. The cell may not switch at the ideal time instant but at a time offset of ΔTs. The time offset ΔTs can be positive or negative. The modelling of the skew error may be done in the following way. FIG. 6A shows an example of skew of a DAC cell and FIG. 6B shows an error pulse due to the skew. In the example shown in FIG. 6A, a single DAC cell switches with a 01011 pattern. In this example, the cell is switching delayed by ΔTs relative to an ideal cell, i.e., the actual cell output 604 is delayed by ΔTs relative to the ideal cell output 602. Whenever the cell is transitioning from state 0 (off) to state 1 (on), or vice versa, an error is introduced that has the energy of cell amplitude A times the skew error ΔTs: $A \cdot \Delta T_s$. This error pulse (i.e., the skewed cell output minus the ideal cell output) is either positive or negative or zero depending on the transition of the cell. Since the cell is switching too late in this example shown in FIG. 6A, the error pulses 612 and 616 are negative when the cell is switching from 0 to 1 (the skewed cell output minus the ideal output<0) and the error pulses 614 and 618 are positive when the cell is switching from 1 to 0 (the skewed cell output minus the ideal output>0). When the cell is not switching at all no error is introduced. For example, the error can be modelled as the derivative of the cell input $x_n$ times the cell amplitude times the skew error as follows:

$$E_{cell}(n) = (x_n(n) - x_n(n-1))A\Delta T_s. \qquad \text{Equation (2)}$$

This is a representation of the error energy of the cell due to skew suitable for digital modelling. In examples, a correction pulse is generated by the correction DAC 530 to cancel or reduce the error pulse.

It can be seen from FIGS. 6A and 6B that the skew error is happening at the transition of the cell or around the sampling clock time instants. For accurate correction of the skew error, the correction values need to be applied at the time point when the error is occurring. Assuming the correction is performed by a correction DAC 530 that has the same sampling clock frequency as the main DAC 510, the very short pulses of the skew error may not be accurately represented. Yet, applying the correct error energy $E_{cell}(n)$ at the clock time instant $T_{clk}(n)-T_{clk}/2$ is a good representation of the error as the center of gravity of the error pulse and correction pulse are nearly identical. In illustrative, non-limiting, examples, the correction pulse to cancel the error pulse may be spread out over an entire clock period $T_{clk}$, yielding a correction pulse amplitude as follows:

$$A_{corr}(n) = E_{cell}(n)/T_{clk}(n) = \frac{(x_n(n) - x_n(n-1))A\Delta T_s}{T_{clk}(n)}. \qquad \text{Equation (3)}$$

Figure 6C:
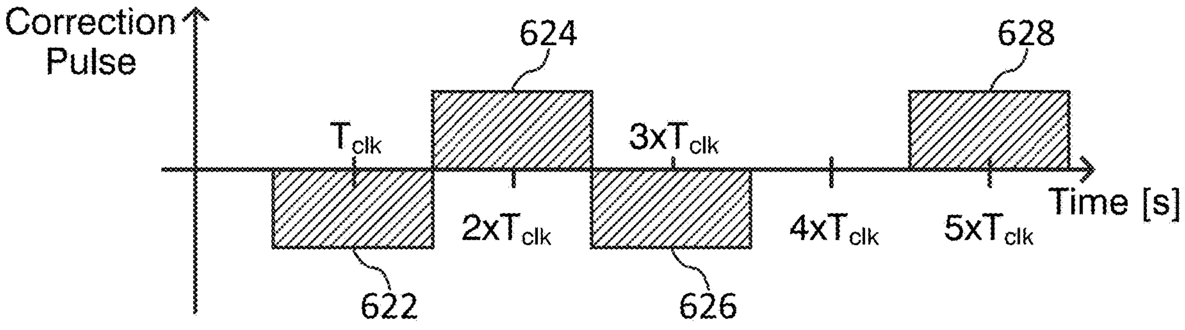
FIG. 6C shows correction pulses applied by the correction DAC for cancelling/reducing the skew errors.

FIG. 6C shows correction pulses 622, 624, 626, 628 applied by the correction DAC 530 for cancelling/reducing the skew errors (error pulses 612, 614, 614, 618) shown in FIG. 6B. In this example, each correction pulse 622, 624, 626, 628 is spread out over an entire clock period $T_{clk}$. Since the random skew is not varying, or only very little varying, over time, the term $A\Delta T_s/T_{clk}$ in Equation (3) can be regarded as constant, which greatly simplifies the calculations.

In examples, as shown in FIG. 6C, each correction pulse 622, 624, 626, 628 may be shifted by half a clock period. Alternatively, the correction pulses 622, 624, 626, 628 may not be shifted in time. If the time at which the correction (a correction pulse) is applied is shifted by half a clock, the correction DAC 530 should be out-phased from the main DAC 510 by half a clock cycle. This may be done by either delaying the main DAC 510 by half a clock or skipping ½ clock delay for the correction DAC 510, e.g., by omitting one latch inside a flipflop. This may be performed without incurring additional overhead since the DAC data path up to the final driver of the DAC cells includes a number of latches, typically 3-5 in a high-speed DAC, such that one latching stage can be omitted for the skew error correction DAC 530 without disrupting the homogeneity of the array. The clock in a high-speed DAC is usually a (pseudo-) differential clock. In such case, a local clock inversion may be done only by a wire-crossing.

Figure 7:
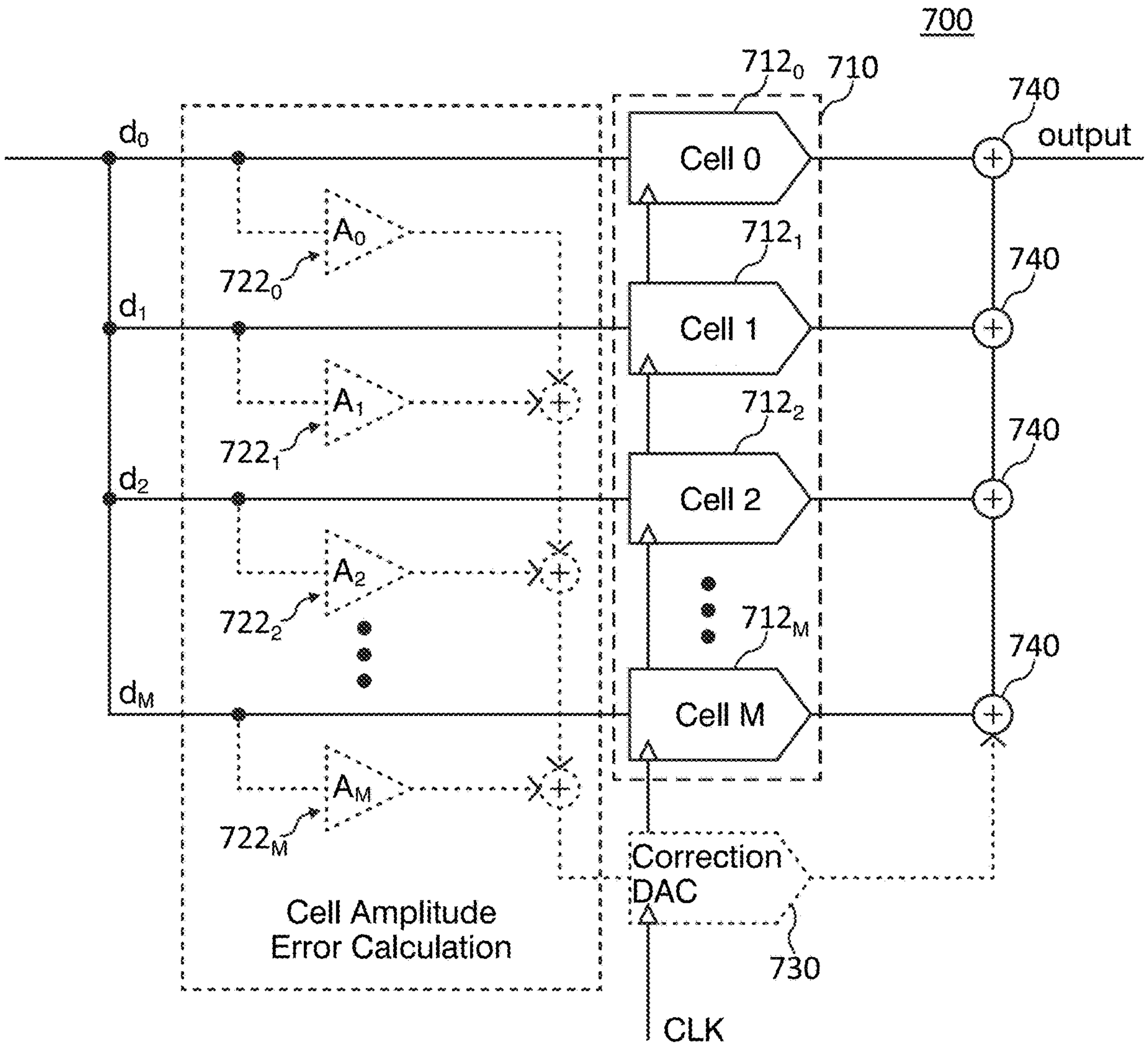
FIG. 7 shows an example implementation of a DAC for amplitude error correction.

FIG. 7 shows an example implementation of a DAC for amplitude error correction. The DAC 700 includes a main DAC 710, a cell error determination circuit 720, a correction DAC 730, and a combiner(s) 740. The main DAC 710 includes a plurality of cells (Cell 0 to Cell M) $\mathbf{712}_0$-$\mathbf{712}_M$. Each cell $\mathbf{712}_0$-$\mathbf{712}_M$ generates an output that contributes to the output of the DAC 700 based on the input bit to each cell $\mathbf{712}_0$-$\mathbf{712}_M$. The input bit may be a binary-coded bit or a thermometer coded bit, or the like. Cell 0 $\mathbf{712}_0$ generates an output based on input bit do, Cell 1 $\mathbf{712}_1$ generates an output based on input bit d1, and so on. The outputs of the plurality of cells $\mathbf{712}_0$-$\mathbf{712}_M$ are combined by a combiner(s) 740 to generate the DAC output.

The cell error determination circuit 720 determines the cell error, in this example the amplitude error. The amplitude errors are calculated on a per cell basis and then summed. The cell error determination circuit 720 may include a digital filter $\mathbf{722}_0$-$\mathbf{722}_M$ (e.g., a multiplier for amplitude scaling) for each cell $\mathbf{712}_0$-$\mathbf{712}_M$ of the main DAC 710. The digital input bit to each cell $\mathbf{712}_0$-$\mathbf{712}_M$ of the main DAC 710 is input to the corresponding digital filter $\mathbf{722}_0$-$\mathbf{722}_M$. Each digital filter $\mathbf{722}_0$-$\mathbf{722}_M$ multiplies the input bit with a coefficient for the corresponding cell $\mathbf{712}_0$-$\mathbf{712}_M$ to generate an amplitude error that the corresponding cell $\mathbf{712}_0$-$\mathbf{712}_M$ introduces to the DAC output.

The amplitude error that each cell introduces is predetermined and the corresponding coefficient is pre-determined based on the amplitude error of each cell. The coefficient is multiplied to each input data bit and summed over the entire cells and the sum is sent to the correction DAC 730. The correction DAC output is subtracted from the output of the main DAC 710. For correction of the amplitude error, the correction DAC 730 may be in phase with the main DAC 710, using the same clock.

Figure 8:
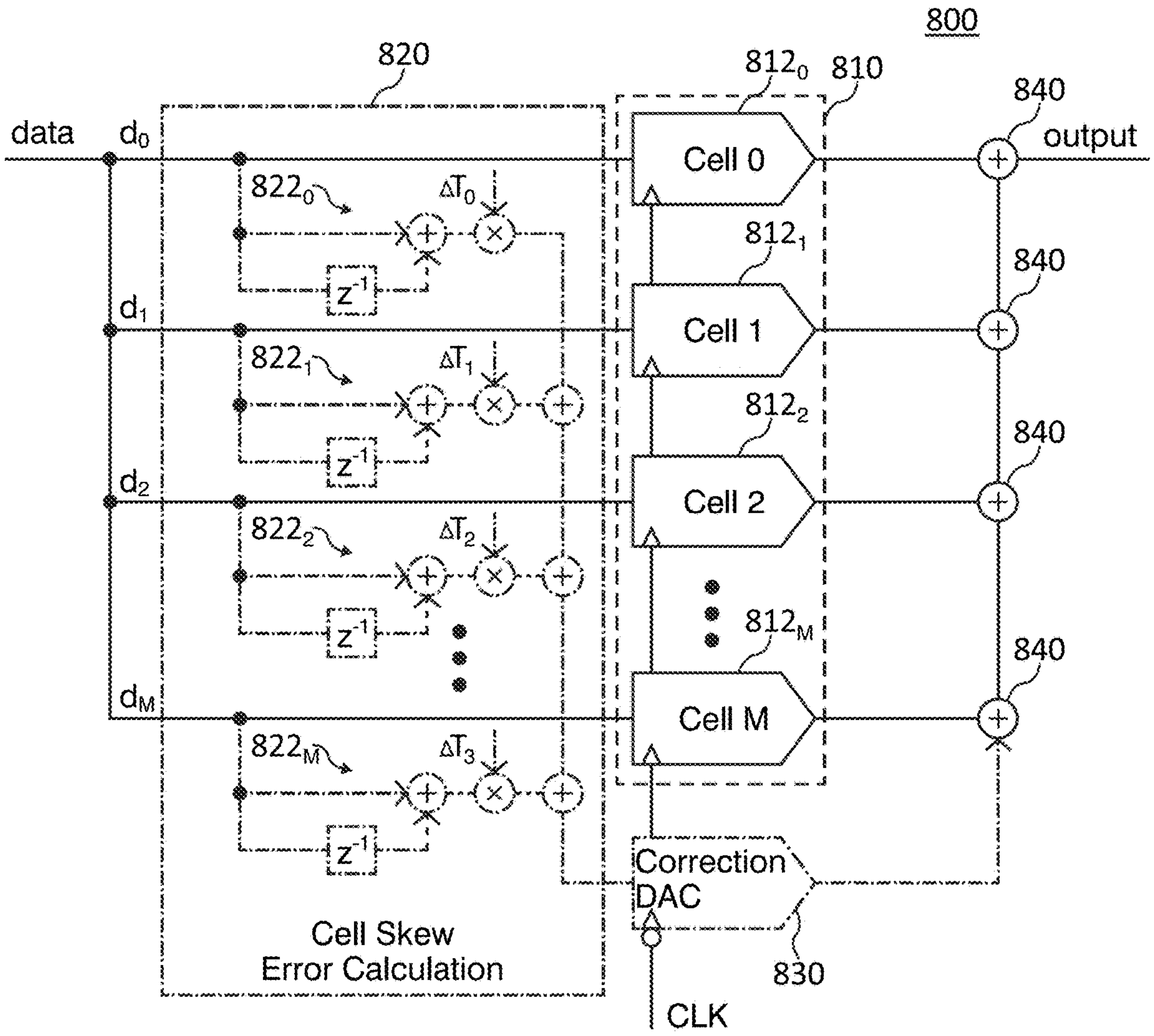
FIG. 8 shows an example implementation of a DAC for correcting skew errors.

FIG. 8 shows an example implementation of a DAC for correcting skew errors. The DAC 800 includes a main DAC 810, a cell error determination circuit 820, a correction DAC 830, and a combiner(s) 840. The main DAC 810 includes a plurality of cells (Cell 0 to Cell M) $\mathbf{812}_0$-$\mathbf{812}_M$. Each cell $\mathbf{812}_0$-$\mathbf{812}_M$ generates an output that contributes to the output of the DAC 800 based on the input bit to each cell $\mathbf{812}_0$-$\mathbf{812}_M$. The input bit may be a binary-coded bit or a thermometer coded bit, or the like. Cell 0 $\mathbf{812}_0$ generates an output based on input bit d0, Cell 1 $\mathbf{812}_1$ generates an output based on input bit d1, and so on. The outputs of the plurality of cells $\mathbf{812}_0$-$\mathbf{812}_M$ are combined by a combiner(s) 840 to generate the DAC output.

The cell error determination circuit 820 determines the cell error, in this example the skew error. The skew errors are calculated on a per-cell basis and then summed and fed to the correction DAC 830. The cell error determination circuit 820 may include a digital filter $\mathbf{822}_0$-$\mathbf{822}_M$ for each cell $\mathbf{812}_0$-$\mathbf{812}_M$ of the main DAC 810. The digital input bit to each cell $\mathbf{812}_0$-$\mathbf{812}_M$ of the main DAC 810 is input to the corresponding digital filter $\mathbf{822}_0$-$\mathbf{822}_M$. Each digital filter $\mathbf{822}_0$-$\mathbf{822}_M$ processes the input bit for the corresponding cell $\mathbf{812}_0$-$\mathbf{812}_M$ to generate a skew error that the corresponding cell $\mathbf{812}_0$-$\mathbf{812}_M$ introduces to the DAC output. In this example, each digital filter $\mathbf{822}_0$-$\mathbf{822}_M$ processes the input bit according to Equation (3) above. The previous input data is subtracted from the current input data and then multiplied with the ATs value for each DAC cell $\mathbf{812}_0$-$\mathbf{812}_M$ to generate a skew error that the corresponding cell $812_0$-$812_M$ introduces to the DAC output. It should be noted that the model for the skew error determination in FIG. 8 is merely an example and the skew error may be modeled differently. The error may be calculated using a finite impulse response (FIR) filter or an infinite impulse response (IIR) filter. More complex digital filtering may be used to replicate the errors more precisely than the simple derivative function used in Equation (3).

The skew error that each cell introduces is pre-determined and the corresponding filter coefficients are pre-determined based on the skew error of each cell. The errors are summed over the entire cells and the sum is sent to the correction DAC 830. The correction DAC output is subtracted from the output of the main DAC 810. The correction DAC output may be applied over the entire clock cycle. For correction of the skew error, the correction DAC 830 may be out-of-phase with the main DAC 810 (e.g., a half clock cycle). For example, the correction DAC 530 may use the inverted clock phase with respect to the main DAC 510, out-phasing the correction pulses by half a clock. Alternatively, the correction DAC 830 may be in-phase with the main DAC 810.

In some examples, the correction DAC 530, 730, 830 may be re-configured to either correct for amplitude errors or skew errors, applying the correction in-phase or out-phased. Alternatively, skew error correction may be performed with a correction DAC 530, 830 in-phase with the main DAC 510. However, this might yield degraded results especially for higher signal frequencies.

Figure 9:
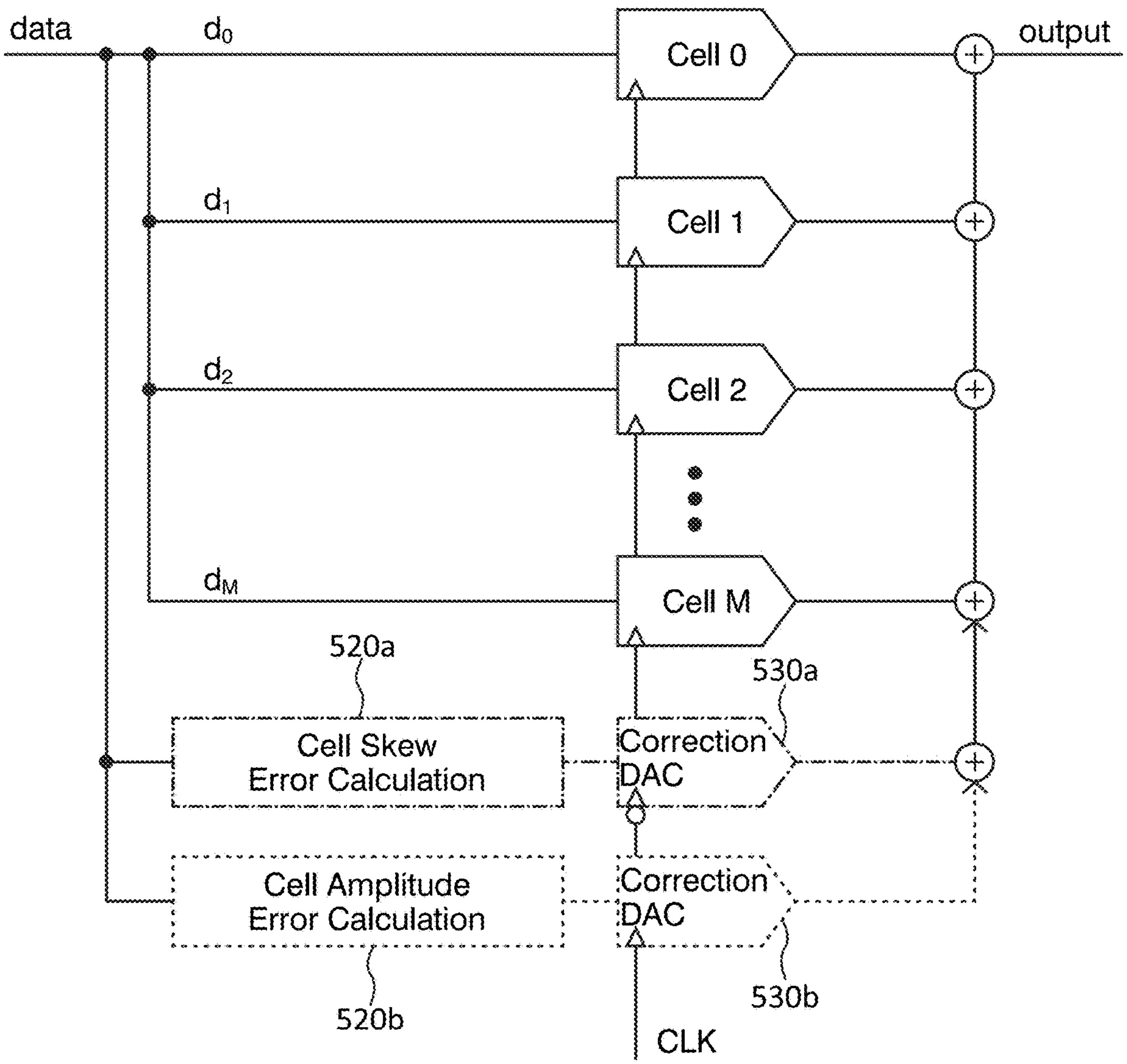
FIG. 9 shows an example DAC including two dedicated correction DACs and cell error determination circuitries for correction of amplitude errors and skew errors.

In some examples, correction of amplitude errors and skew errors may be performed with two dedicated correction circuitries. FIG. 9 shows an example DAC including two dedicated correction DACs 520*a*, 520*b* and cell error determination circuitries 530*a*, 530*b* for correction of amplitude errors and skew errors. In this example, the DAC 500 may include a correction DAC 530*b* operating in phase with the main DAC 510 for correction of an amplitude error determined by a separate cell amplitude error determination circuit 520*b*, and another correction DAC 530*a* operating out of phase of (or in-phase with) the main DAC 510 for correction of a skew error determined by a separate cell skew error determination circuit 520*a*.

In some examples, the amplitude and/or skew error correction may be performed for every DAC cell. Alternatively, the amplitude and/or skew error correction may be limited to a subset of the cells (e.g., cancelling only the most relevant errors). For example, in a segmented DAC, the amplitude and/or skew error correction may be performed for one or more, but not all, segments of the DAC. For example, in a two-segment DAC (e.g., a unary-coded MSB segment and a binary-coded LSB segment), the skew errors of all LSB cells might be so small such that it might be significantly below the quantization noise. In this case, the amplitude and/or skew error correction may be limited to the MSB segment. In a three-segment DAC, the amplitude and/or skew error correction may be limited to the MSB segment or the MSB segment and an intermediate significant bit (ISB) segment. This can be similarly extended to a DAC with more than three segments.

Figure 10A:
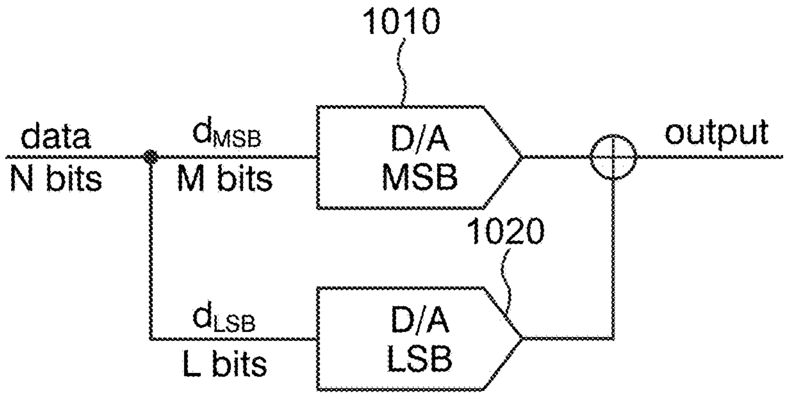
FIG. 10A shows a segmented DAC with two segments.
Figure 10B:
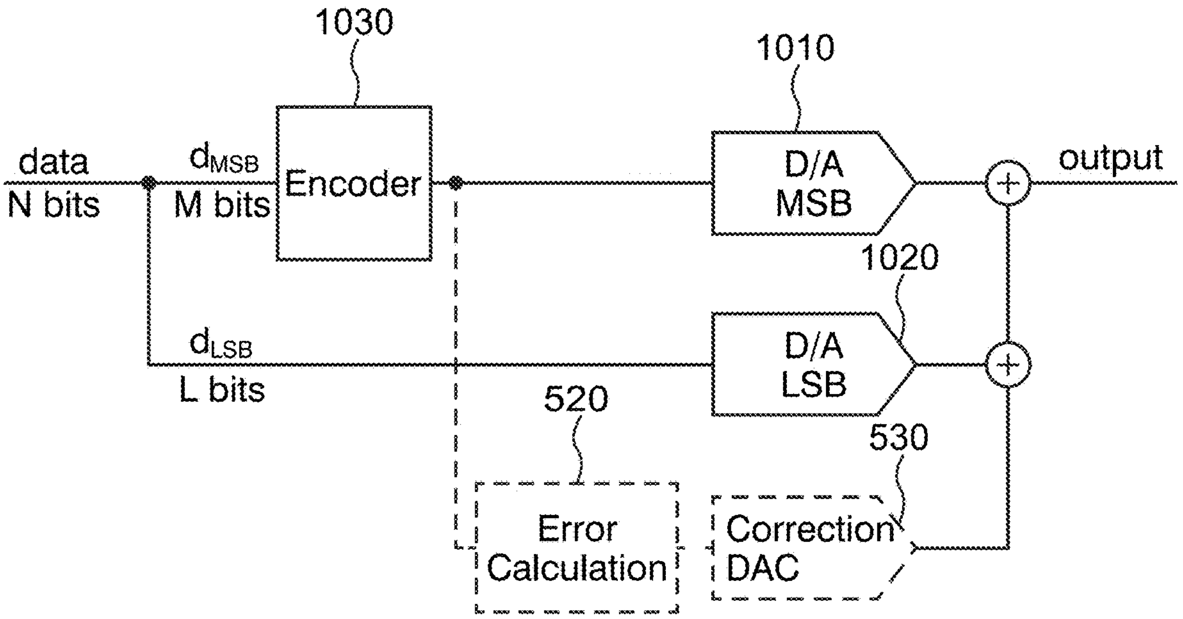
FIG. 10B shows a segmented DAC with error correction applied only for the most-significant bit (MSB) segment.

FIG. 10A shows a segmented DAC with two segments and FIG. 10B shows a segmented DAC with error correction applied only for the MSB segment. The DAC in FIG. 10A includes an MSB segment 1010 and an LSB segment 1020. For example, the MSB segment 1010 may be unary-coded and the LSB segment 1020 may be binary-coded. The segments may be coded differently. The DAC may include any number of segments, for example two, three, four, etc. FIG. 10B shows that the errors can be calculated only for the MSB segment 1010, neglecting the errors introduced in the LSB segment 1020. The error calculation circuit 520 receives the input bits for the MSB segment, e.g., after being encoded by the encoder 1030 and calculates the error for the MSB segment 1010 only. The calculated error is sent to the correction DAC 530 for cancellation of the MSB segment error in analog domain. This can significantly reduce hardware effort for the calculation of the errors.

In some examples, the skew error correction may be performed only for a cell that exhibits a certain degree of error (e.g., at least 0.5 LSB for the term $\Delta_{cell}\Delta T_{s,max}/T_{clk}$ or other lower or higher value), where $A_{cell}$ is the weight or amplitude of the cell and the main scaling factor for the error term, assuming that the random skew mismatch is the same for all cells. $\Delta T_{s,max}$ is the maximum expected skew error (e.g., about 3 times the standard deviation of the random skew). Same may be applied for the amplitude error $\Delta A$. If the amplitude error of a cell is smaller than 0.5 LSB (or any other value), correction may not be applied to such a cell.

The skew errors may be calculated on a per-cell basis which is beneficial for various reasons. In one example, for a segmented DAC in FIG. 10B, the error may be calculated on a unary MSB segment. If dynamic element matching (DEM) is applied to the unary array the error correction needs to consider that the cell assignment to a logical input is varying over time. In such case, the errors may be calculated on the input data of cells after encoding and dynamic element matching. With this scheme, the error calculation is completely unaffected by DEM implementation.

Figure 11:
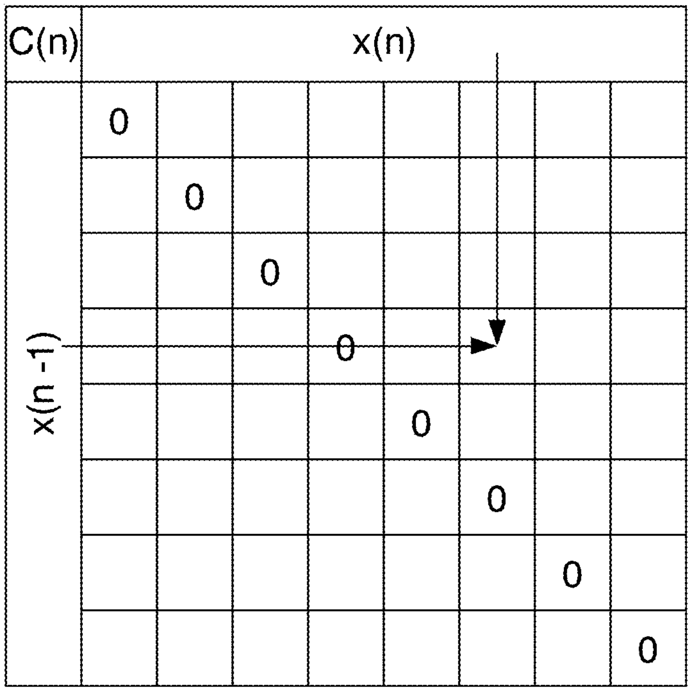
FIG. 11 shows an example two-dimensional (2D) look-up table (LUT) for skew error calculation.

In some examples, the skew errors for a DAC cell may be calculated using a two-dimensional (2D) look-up table (LUT). Since the correction value that needs to be applied for a skew error depends on cell transitions, the previous state of the DAC cells and the new state of the DAC cells are used to find the correction value in a 2D LUT. FIG. 11 shows an example 2D LUT for skew error calculation. The diagonal of the LUT is 0 as those entries would correspond to no changes in cell state between subsequent clocks. In case the LUT is also used to include amplitude errors, the corresponding entries would be a sum or combination of skew and amplitude error correction values. In this case the diagonal of the LUT would no longer be 0. The cell-wise calculation may result in significantly lower hardware necessary and is independent of encoding and dynamic element matching. The 2D LUT may be built up to support the same but for a unary array would then require addressing the LUT with the encoded data.

For dimensioning the correction DAC 530, the biggest possible error that can occur may be considered. The worst-case scenario would be to have very high correlation of all skew errors in the cells or simplified to have all cells with the same maximum timing skew, producing maximum error in every cell. A certain $\Delta T_{s,max}$ may be assumed for maximum skew error. Assuming all cells are showing the same error the maximum correction value is simplified to $\Delta T_{s,max}/T_{clk}$. To map this to the DAC code range the DAC fullscale code is multiplied by this fraction. With N being the number of DAC input bits, the maximum code is $2^N-1$. The maximum necessary correction code assuming the correction DAC 530 has the same scaling as the main DAC 510 is $(2^N-1)\Delta T_{s,max}/T_{clk}$. Assuming a 12-bit DAC, 10 GHZ clock rate and standard deviation of the random skew of 100 fs, the maximum correction code may be calculated as $$(2^{12}-1)\frac{3\times 100fs}{100\text{ ps}} = 12.2.$$

In this case, the necessary number of bits for the correction DAC 530 is only 4 bits compared to the 12 bits of the main DAC 510.

Since the correction DAC 530 is very small if the random skew is small from the beginning the overhead in hardware for implementing the correction DAC 530 is very small as well. Redundant cells and paths in a DAC array may be used for forming the correction DAC. For example, in a DAC that supports dummy switching to equalize switching activity over time the dummy path or part of it may be re-purposed to form a correction DAC.

The same calculation can be done for an amplitude error correction. Assuming the amplitude error from the above example of a standard deviation of 0.5% for amplitude errors, one would come to $(2^{12}-1)$ 3×0.5%=184.3. The number of bits to correct for this would equal 7 bits in the main DAC. This is a very extreme example as 0.5% of cell errors for the biggest cells are very unlikely in a high-performance design.

Figure 12:
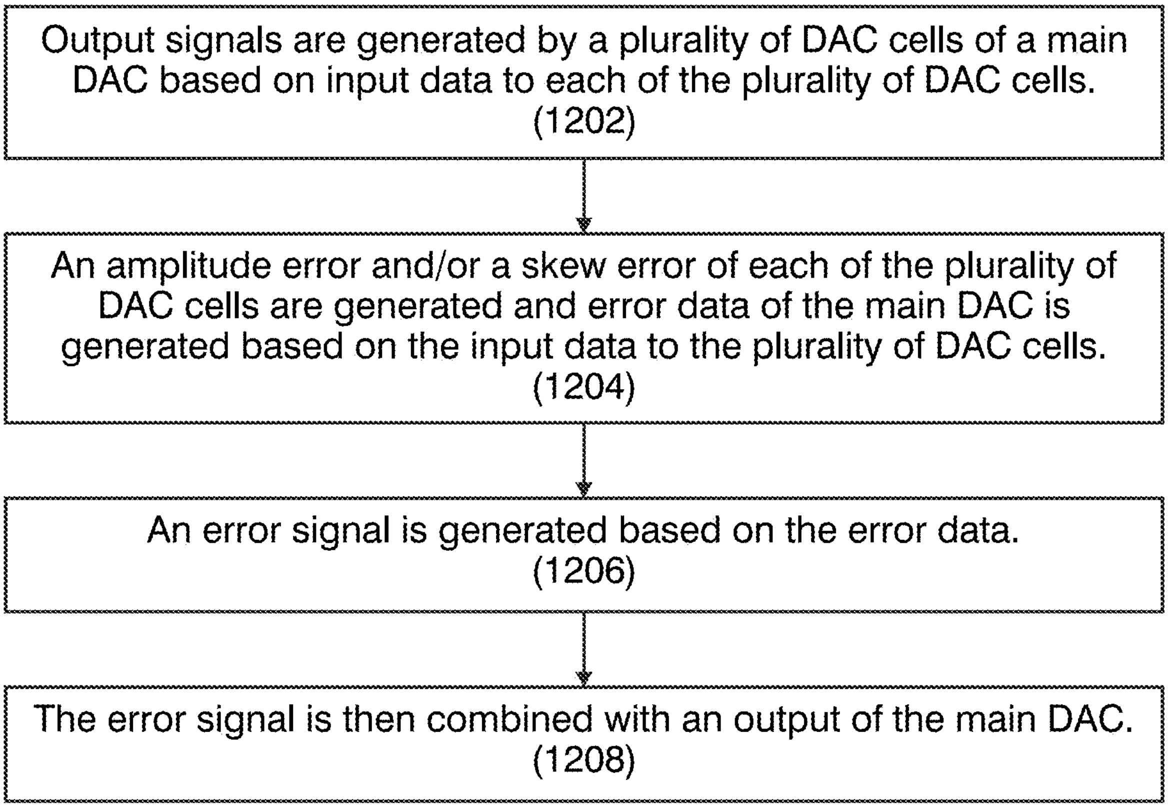
FIG. 12 is a flow diagram of an example method for correcting an amplitude and/or skew error in a DAC.

FIG. 12 is a flow diagram of an example method for correcting an amplitude and/or skew error in a DAC. Output signals are generated by a plurality of DAC cells of a main DAC based on input data to each of the plurality of DAC cells (1202). An amplitude error and/or a skew error of each of the plurality of DAC cells are generated and error data of the main DAC is generated based on the input data to the plurality of DAC cells (1204). An error signal is generated based on the error data (1206). The error signal is then combined with an output of the main DAC (1208). In examples, a pre-determined coefficient is multiplied to the input data for each DAC cell to determine the amplitude error of each DAC cell. In examples, a pre-determined time skew of each DAC cell is multiplied to a difference of a current input data and a previous input data for each DAC cell to determine the skew error of each DAC cell. The error signal for the skew error may be combined out-of-phase with an output of the main DAC. Alternatively, the error signal for the skew error may be combined in-phase with an output of the main DAC. In some examples, the error signal for the skew error may be spread over a clock cycle of the main DAC. The main DAC may be a segmented DAC including two or more segments, and the amplitude error and/or the skew error may be determined for a subset of the two or more segments.

Figure 13:
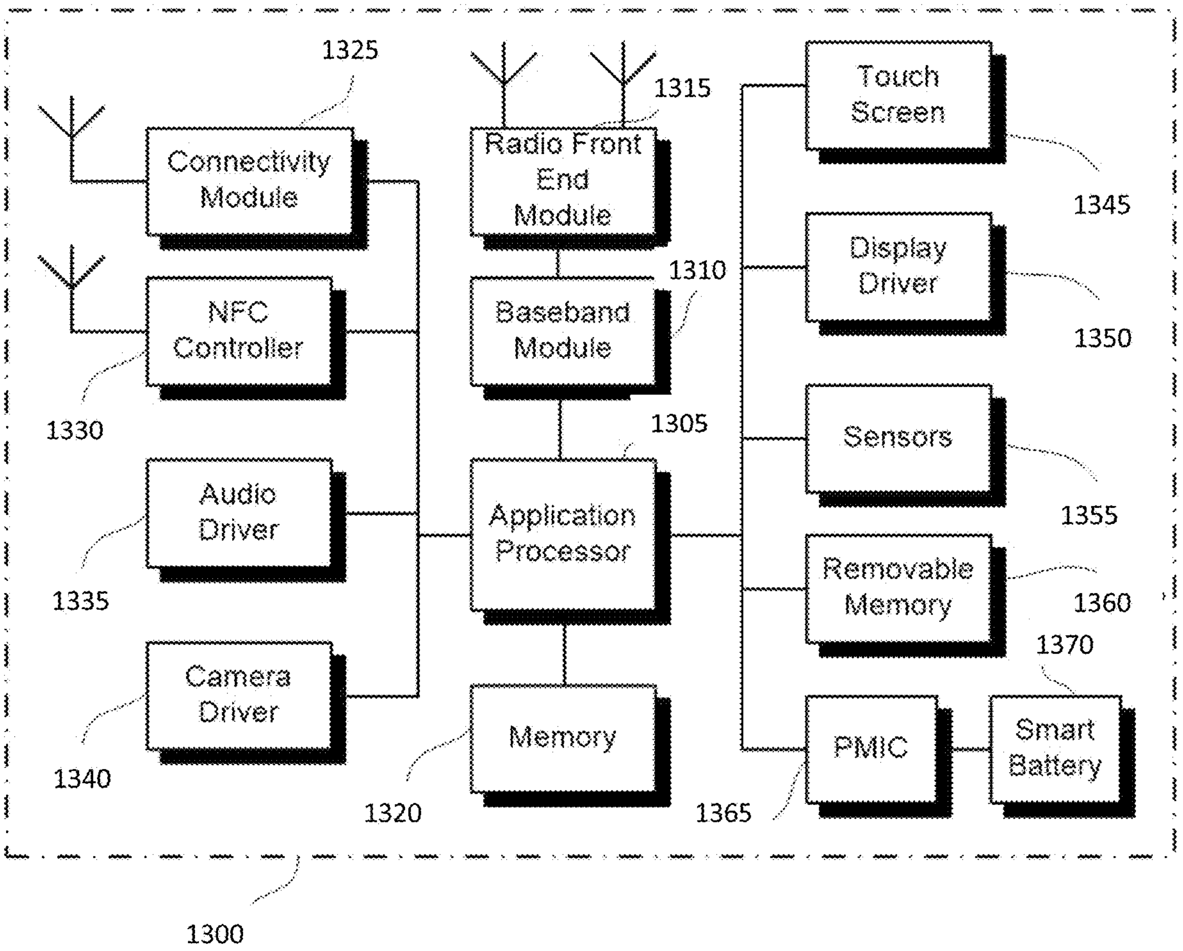
FIG. 13 illustrates a user device in which the examples disclosed herein may be implemented.

FIG. 13 illustrates a user device 1300 in which the examples disclosed herein may be implemented. For example, the examples disclosed herein may be implemented in the radio front-end module 1315, in the baseband module 1310, etc. The user device 1300 may be a mobile device in some aspects and includes an application processor 1305, baseband processor 1310 (also referred to as a baseband module), radio front end module (RFEM) 1315, memory 1320, connectivity module 1325, near field communication (NFC) controller 1330, audio driver 1335, camera driver 1340, touch screen 1345, display driver 1350, sensors 1355, removable memory 1360, power management integrated circuit (PMIC) 1365 and smart battery 1370.

In some aspects, application processor 1305 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1310 may be implemented, for example, as a solder-down substrate including one or more integrated circuits, a single packaged integrated circuit soldered to a main circuit board, and/or a multi-chip module containing two or more integrated circuits.

Figure 14:
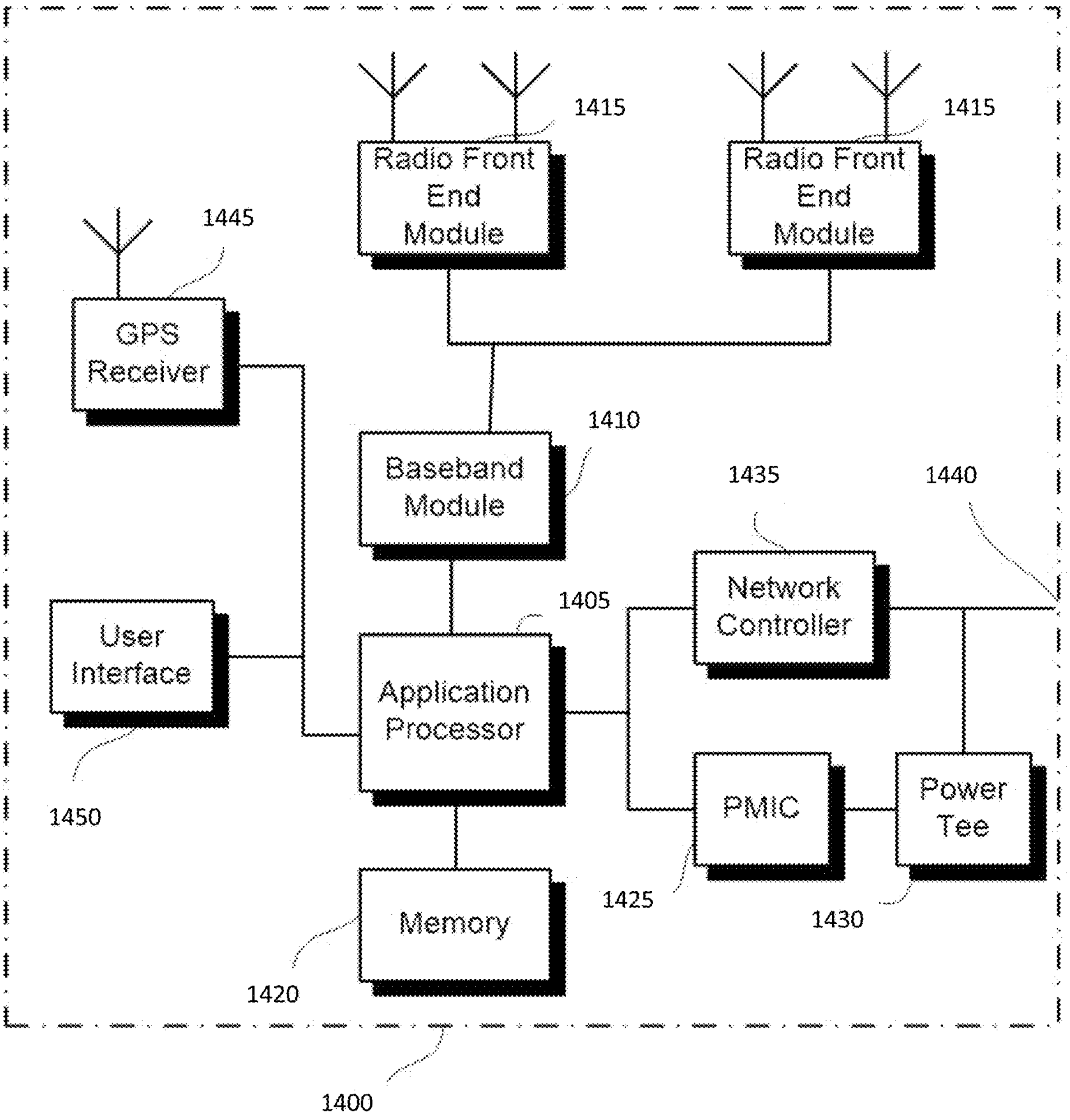
FIG. 14 illustrates a base station or infrastructure equipment radio head in which the examples disclosed herein may be implemented.

FIG. 14 illustrates a base station or infrastructure equipment radio head 1400 in which the examples disclosed herein may be implemented. For example, the examples disclosed herein may be implemented in the radio front-end module 1415, in the baseband module 1410, etc. The base station radio head 1400 may include one or more of application processor 1405, baseband modules 1410, one or more radio front end modules 1415, memory 1420, power management circuitry 1425, power tee circuitry 1430, network controller 1435, network interface connector 1440, satellite navigation receiver module 1445, and user interface 1450.

In some aspects, application processor 1405 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1410 may be implemented, for example, as a solder-down substrate including one or more integrated circuits, a single packaged integrated circuit soldered to a main circuit board or a multi-chip module containing two or more integrated circuits.

In some aspects, memory 1420 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1420 may be implemented as one or more of solder down packaged integrated circuits, socketed memory modules and plug-in memory cards.

In some aspects, power management integrated circuitry 1425 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1430 may provide for electrical power drawn from a network cable to provide both power supply and data connectivity to the base station radio head 1400 using a single cable.

In some aspects, network controller 1435 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1445 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1445 may provide data to application processor 1405 which may include one or more of position data or time data. Application processor 1405 may use time data to synchronize operations with other radio base stations.

In some aspects, user interface 1450 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a DAC comprising a main DAC including a plurality of DAC cells, wherein each DAC cell is configured to generate an output signal for the main DAC based on input data for each DAC cell, cell error determination circuit configured to determine an amplitude error and/or a skew error of each of the plurality of DAC cells and generate error data of the DAC based on the input data to the DAC cells, a correction DAC configured to generate an error signal based on the error data, and a combiner configured to combine the error signal with an output of the main DAC.

Another example, (e.g., example 2) relates to a previously described example (e.g., example 1), wherein the cell error determination circuit is configured to multiply a pre-determined coefficient to the input data for each DAC cell to determine the amplitude error of each DAC cell.

Another example, (e.g., example 3) relates to a previously described example (e.g., example 2), wherein the correction DAC is configured to generate the error signal for the amplitude error in-phase with an output of the main DAC.

Another example, (e.g., example 4) relates to a previously described example (e.g., any one of examples 1-3), wherein the cell error determination circuit is a digital FIR filter or a digital IIR filter.

Another example, (e.g., example 5) relates to a previously described example (e.g., any one of examples 1-4), wherein the amplitude error and/or the skew error of each of the plurality of DAC cells is determined using an LUT.

Another example, (e.g., example 6) relates to a previously described example (e.g., any one of examples 1-5), wherein the cell error determination circuit is configured to multiply a pre-determined time skew of each DAC cell to a difference of a current input data and a previous input data for each DAC cell to determine the skew error of each DAC cell.

Another example, (e.g., example 7) relates to a previously described example (e.g., example 6), wherein the correction DAC is configured to generate the error signal for the skew error out-of-phase with an output of the main DAC.

Another example, (e.g., example 8) relates to a previously described example (e.g., example 6), wherein the correction DAC is configured to generate the error signal for the skew error in-phase with an output of the main DAC.

Another example, (e.g., example 9) relates to a previously described example (e.g., any one of examples 6-8), wherein the correction DAC is configured to generate the error signal for the skew error spread over a clock cycle of the main DAC.

Another example, (e.g., example 10) relates to a previously described example (e.g., any one of examples 1-9), wherein the main DAC is a segmented DAC including two or more segments, wherein each segment includes a plurality of DAC cells.

Another example, (e.g., example 11) relates to a previously described example (e.g., example 10), wherein the error determination circuit is configured to determine the amplitude error and/or the skew error for a subset of the two or more segments.

Another example, (e.g., example 12) relates to a previously described example (e.g., example 11), wherein the error determination circuit is configured to determine the amplitude error and/or the skew error for a MSB segment only.

Another example, (e.g., example 13) relates to a previously described example (e.g., example 11), wherein the error determination circuit is configured to determine the amplitude error and/or the skew error for a MSB segment and an ISB segment only.

Another example, (e.g., example 14) relates to a previously described example (e.g., any one of examples 1-13), wherein the correction DAC is reconfigurable to apply the correction signal either in-phase or out-of-phase with the main DAC.

Another example, (e.g., example 15) relates to a previously described example (e.g., any one of examples 1-14), wherein the cell error determination circuit includes a first cell error determination circuit configured to determine an amplitude error of each of the plurality of DAC cells and a second cell error determination circuit configured to determine a skew error of each of the plurality of DAC cells, wherein the correction DAC includes a first correction DAC configured to generate an error signal for the amplitude error and a second correction DAC configured to generate an error signal for the skew error.

Another example, (e.g., example 16) relates to a method for correcting amplitude and/or skew error in a DAC. The method includes generating, by a plurality of DAC cells of a main DAC, output signals based on input data to each of the plurality of DAC cells, determining an amplitude error and/or a skew error of each of the plurality of DAC cells and generating error data of the main DAC based on the input data to the plurality of DAC cells, generating an error signal based on the error data, and combining the error signal with an output of the main DAC.

Another example, (e.g., example 17) relates to a previously described example (e.g., example 16), wherein a pre-determined coefficient is multiplied to the input data for each DAC cell to determine the amplitude error of each DAC cell.

Another example, (e.g., example 18) relates to a previously described example (e.g., any one of examples 16-17), wherein a pre-determined time skew of each DAC cell is multiplied to a difference of a current input data and a previous input data for each DAC cell to determine the skew error of each DAC cell.

Another example, (e.g., example 19) relates to a previously described example (e.g., any one of examples 16-18), wherein the error signal for the skew error is combined out-of-phase with an output of the main DAC.

Another example, (e.g., example 20) relates to a previously described example (e.g., any one of examples 16-19), wherein the error signal for the skew error is spread over a clock cycle of the main DAC.

Another example, (e.g., example 21) relates to a previously described example (e.g., any one of examples 16-20), wherein the main DAC is a segmented DAC including two or more segments, and the amplitude error and/or the skew error is determined for a subset of the two or more segments.

Another example, (e.g., example 22) relates to a machine-readable medium including code, when executed, to cause a machine to perform the method as in any one of examples 16-21.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A digital-to-analog converter (DAC), comprising:

a main DAC including a plurality of DAC cells, wherein each DAC cell is configured to generate an output signal for the main DAC based on input data for each DAC cell;

cell error determination circuit configured to determine an amplitude error and/or a skew error of each of the plurality of DAC cells and generate error data of the DAC based on the input data to the DAC cells;

a correction DAC configured to generate an error signal based on the error data; and a combiner configured to combine the error signal with an output of the main DAC.

2. The DAC of claim 1, wherein the cell error determination circuit is configured to multiply a pre-determined coefficient to the input data for each DAC cell to determine the amplitude error of each DAC cell.

3. The DAC of claim 2, wherein the correction DAC is configured to generate the error signal for the amplitude error in-phase with an output of the main DAC.

4. The DAC of claim 1, wherein the cell error determination circuit is a digital finite impulse response (FIR) filter or a digital infinite impulse response (IIR) filter.

5. The DAC of claim 1, wherein the amplitude error and/or the skew error of each of the plurality of DAC cells is determined using a look-up table (LUT).

6. The DAC of claim 1, wherein the cell error determination circuit is configured to multiply a pre-determined time skew of each DAC cell to a difference of a current input data and a previous input data for each DAC cell to determine the skew error of each DAC cell.

7. The DAC of claim 6, wherein the correction DAC is configured to generate the error signal for the skew error out-of-phase with an output of the main DAC.

8. The DAC of claim 6, wherein the correction DAC is configured to generate the error signal for the skew error in-phase with an output of the main DAC.

9. The DAC of claim 6, wherein the correction DAC is configured to generate the error signal for the skew error spread over a clock cycle of the main DAC.

10. The DAC of claim 1, wherein the main DAC is a segmented DAC including two or more segments, wherein each segment includes a plurality of DAC cells.

11. The DAC of claim 10, wherein the error determination circuit is configured to determine the amplitude error and/or the skew error for a subset of the two or more segments.

12. The DAC of claim 11, wherein the error determination circuit is configured to determine the amplitude error and/or the skew error for a most-significant bit (MSB) segment only.

13. The DAC of claim 11, wherein the error determination circuit is configured to determine the amplitude error and/or the skew error for a most-significant bit (MSB) segment and an intermediate-significant bit (ISB) segment only.

14. The DAC of claim 1, wherein the correction DAC is reconfigurable to apply the correction signal either in-phase or out-of-phase with the main DAC.

15. The DAC of claim 1, wherein the cell error determination circuit includes a first cell error determination circuit configured to determine an amplitude error of each of the plurality of DAC cells and a second cell error determination circuit configured to determine a skew error of each of the plurality of DAC cells, wherein the correction DAC includes a first correction DAC configured to generate an error signal for the amplitude error and a second correction DAC configured to generate an error signal for the skew error.

16. A method for correcting amplitude and/or skew error in a digital-to-analog converter (DAC), the method comprising:

generating, by a plurality of DAC cells of a main DAC, output signals based on input data to each of the plurality of DAC cells;

determining an amplitude error and/or a skew error of each of the plurality of DAC cells and generating error data of the main DAC based on the input data to the plurality of DAC cells;

generating an error signal based on the error data; and combining the error signal with an output of the main DAC.

17. The method of claim 16, wherein a pre-determined coefficient is multiplied to the input data for each DAC cell to determine the amplitude error of each DAC cell.

18. The method of claim 16, wherein a pre-determined time skew of each DAC cell is multiplied to a difference of a current input data and a previous input data for each DAC cell to determine the skew error of each DAC cell.

19. The method of claim 16, wherein the error signal for the skew error is combined out-of-phase with an output of the main DAC.

20. The method of claim 16, wherein the error signal for the skew error is spread over a clock cycle of the main DAC.

21. The method of claim 16, wherein the main DAC is a segmented DAC including two or more segments, and the amplitude error and/or the skew error is determined for a subset of the two or more segments.

22. A non-transitory machine-readable medium including code, when executed, to cause a machine to perform a method comprising:

generating, by a plurality of digital-to-analog converter (DAC) cells of a main DAC, output signals based on input data to each of the plurality of DAC cells;

determining an amplitude error and/or a skew error of each of the plurality of DAC cells and generating error data of the main DAC based on the input data to the plurality of DAC cells;

generating an error signal based on the error data; and combining the error signal with an output of the main DAC.

* * * * *